NEGATIVE CONDUCTANCE DIODE AMPLIFIER

Filed May 13, 1959 2 Sheets-Sheet 1

INVENTOR.
KERN K. N. CHANG
BY Joseph D. Black
ATTORNEY

March 31, 1964 K. K. N. CHANG 3,127,567

NEGATIVE CONDUCTANCE DIODE AMPLIFIER

Filed May 13, 1959 2 Sheets-Sheet 2

INVENTOR.
KERN K. N. CHANG
BY Joseph D. Black
ATTORNEY

United States Patent Office 3,127,567
Patented Mar. 31, 1964

3,127,567
NEGATIVE CONDUCTANCE DIODE AMPLIFIER
Kern K. N. Chang, Princeton, N.J., assignor to Radio Corporation of America, a corporation of Delaware
Filed May 13, 1959, Ser. No. 812,842
17 Claims. (Cl. 330—34)

This invention relates to negative-conductance amplifiers, and particularly to a circuit arrangement in which a semiconductor diode element of a negative conductance is used to amplify and input alternating current (A.C.) signal voltage.

The use of certain tubes having a negative conductance characteristic for the purpose of amplification has been suggested, for example, in an article entitled "Negative Resistance and Devices for Obtaining It," by E. W. Herold, Proceedings of the I.R.E., vol. 23, No. 10, October 1935, pages 1201–1223.

An object of the invention is to provide a novel, improved negative-conductance amplifier.

A further object is to provide a circuit arrangement using a negative-conductance, semiconductor diode element for amplification, thereby providing a negative-conductance amplifier which is compact in construction and simple in operation.

An amplifier according to an embodiment of the invention comprises a semiconductor diode element exhibiting a negative resistance, and an inductance associated with the effective capacitance of the diode to form an inductance-capacitance tuned circuit resonant at the operating frequency of the amplifier. Suitable means are provided for supplying a direct current (D.C.) bias to the diode so as to bias the diode for operation at a desired point on the negative slope of the current-voltage characteristic curve thereof. In operation, an alternating current signal voltage is applied to the resonant circuit and the amplified signal voltage is derived therefrom.

The invention will be described in greater detail with the aid of the attached drawing wherein.

Figure 3:
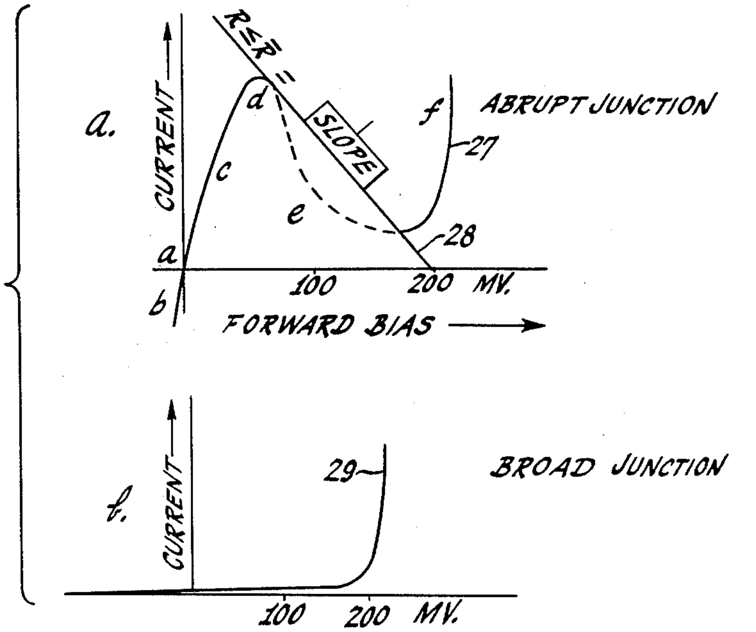
Figure 4:
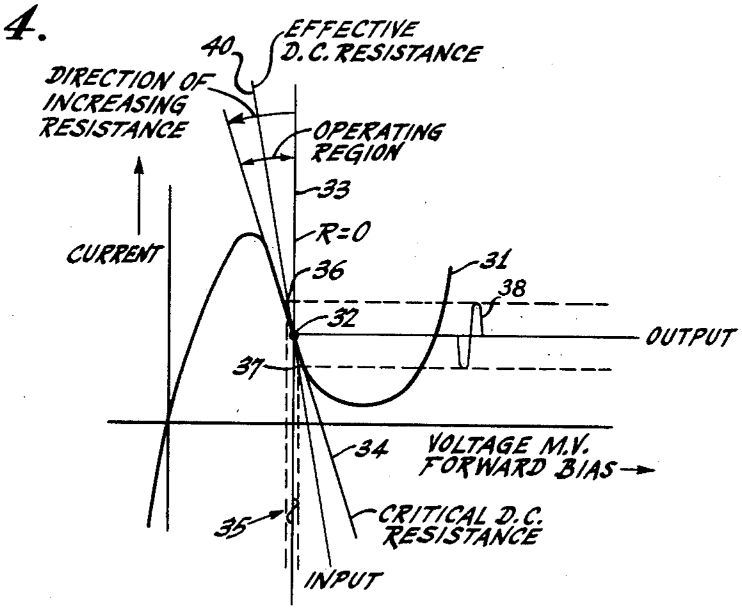
Figure 5:
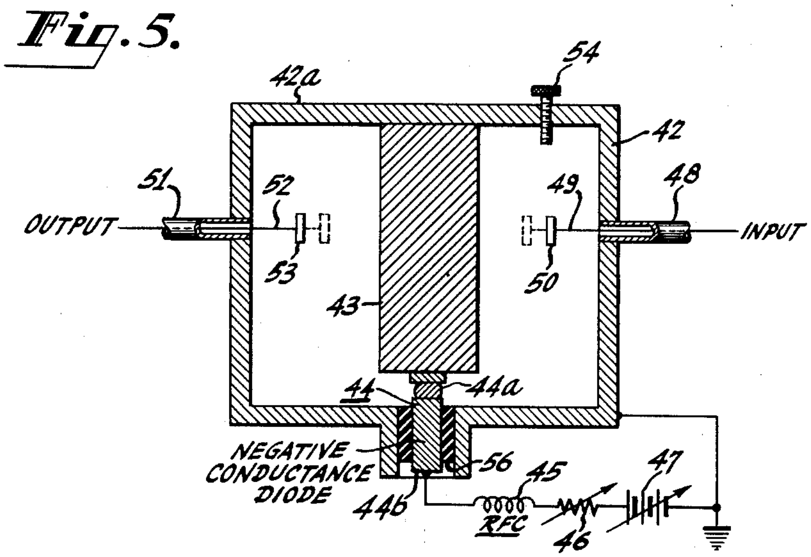

FIGURES 3*a* and 3*b* are graphs comparing the voltage current characteristic of the junction diode used herein with that of a typical junction diode not having a negative resistance characteristic;

FIGURE 4 is a curve useful in describing the operation of the invention; and,

FIGURE 5 is a circuit diagram of another embodiment of a negative-conductance amplifier constructed according to the invention.

Figure 1:
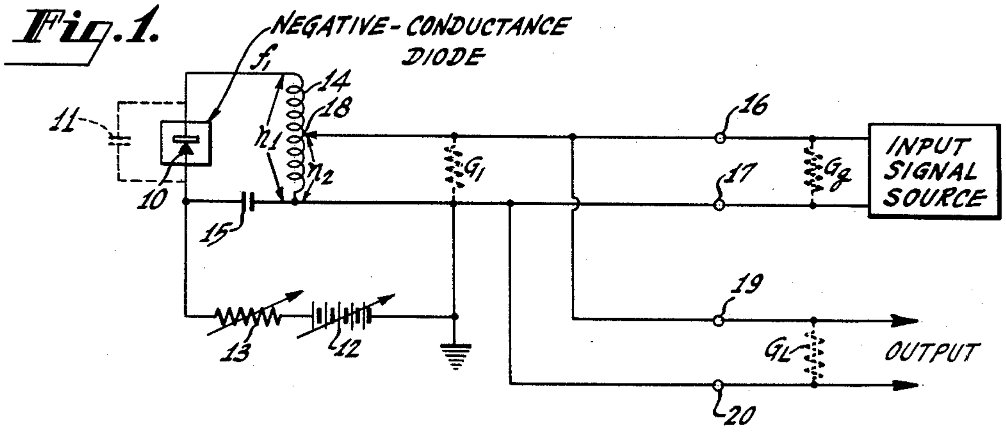
FIGURE 1 is a circuit diagram of one embodiment of a negative-conductance amplifier constructed according to the invention.

In the amplifier of the invention illustrated in FIGURE 1, a negative conductance diode 10, having a capacitance 11, is energized by a battery or source of unidirectional potential 12 through a load resistance 13. The resistance 13 desirably is smaller than the negative resistance of the diode 10 so that stable biasing results. The diode 10 is biased at a point at which the negative conductance is realized by an appropriate adjustment of the resistance 13 and the battery 12. The diode 10 is shunted by a series connected inductor 14 and D.C. blocking capacitor 15. The circuit values of the tank circuit which includes the diode 10 internal capacity and the inductor 14 determines the amplifier resonant frequency $f_1$. The inductor 14 may be variable to provide for tuning the tank to different A.C. frequencies. An alternating current signal of frequency $f_1$ to be amplifier is applied via terminals 16, 17 between a variable tap 18 on the inductor 14 and a point of reference potential. An output circuit, not shown, but represented by the conductance $G_L$ is also connected to the tank circuit between the tap 18 and the point of reference potential to derive an amplified output signal at the output terminals 19, 20 for application to a desired utilization circuit or load connected across terminals 19, 20. The tap 18 is set so as to match the input and output circuits to the tank circuit.

The conductance $G_l$ represents the loss conductance of the tank, conductance $G_g$ represents the input source conductance and the conductance $G_L$ represents the load conductance. For stability, the R.F. conductance presented to the tank circuit by the combination of the conductance $G_g$ of the source of the input signal and the load conductance $G_L$ of the load L through the tap transformation is preferably larger than the negative conductance G of the diode.

Figure 2:
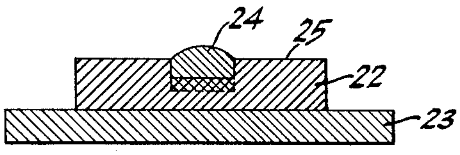
FIGURE 2 is a sectional view of a typical diode used in the arrangement of FIGURE 1.

Before describing the operation of the amplifier shown in FIGURE 1, reference is made to FIGURE 2 which is a sectional view of a typical negative conductance diode that may be used in the arrangement of the invention. By way of example, Leo Esaki, Physical Review, vol. 109, page 603, 1958, has reported a thin or abrupt junction diode exhibiting a negative conductance over a region of low forward bias voltage, i.e. less than 0.3 volt. The diode was prepared with a semiconductor having a free charge carrier concentration several orders of magnitude higher than that used in conventional diodes.

For the sake of completeness, a diode which was constructed and could be used in practicing the invention is now described. A single crystal bar of n-type germanium is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 22 is cut from the bar along the 111 plane, i.e. a plane perpendicular to the 111 crystallographic axis of the crystal. The wafer 22 is etched to a thickness of about 2 mils with a conventional etch solution. A major surface of this wafer 22 is soldered to a strip 23 of nickel, with a conventional lead-tin-arsenic solder, to provide a non-rectifying contact between the wafer 22 and the strip 23. The nickel strip 23 serves eventually as a base lead. A 5 mil diameter dot 24 of 99 percent by weight indium, 0.5 percent by weight zinc and 0.5 weight percent gallium is placed with a small amount of a commercial flux on the free surface 25 of the germanium wafer 22 and then heated at 450° C. for one minute in an atmosphere of dry hydrogen to alloy a portion of the dot to the free surface 25 of the wafer 22, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot with a low impedance lead.

One semiconductor device prepared according to the above example exhibits the following characteristics:

$\bar{R}$=10 ohms (Ω)
$C$=50 micromicrofarads (μμf.)
$\bar{R}C$=0.5 millimicrosecond (mμs.)

Wherein $\bar{R}$ is the average value of the negative resistance from current maximum to current minimum; C is the capacitance of the junction at the operating point of the diode; and $\overline{R}C$ is the approximate time constant determining the frequency characteristic of the diode.

For this data, the gain-bandwidth product, is calculated to be about 300 mc./s., and the highest fundamental frequency at which a lumped parameter circuit including such a diode may oscillate is 180 megacycles per second (mc./s.).

Other semiconductors may be used instead of germanium, particularly silicon and the III–V compounds. A III–V compound is a compound composed of an element from group III and group V of the periodic table of chemical elements, such as gallium arsenide, indium arsenide and indium antimonide. Where III–V compounds are used, the p and n type impurities ordinarily used in those compounds are also used to form the diode described. Thus, sulfur is a suitable n-type impurity and zinc a suitable p-type impurity which is also suitable for alloying.

In the operation of a typical semiconductor diode of the type set forth above, with no bias applied, it is believed that the Fermi level on the p side of the p-n junction is in the valence band, while the Fermi level on the n side of the p-n junction is in the conduction band. The diode conducts electric current in the forward direction by two processes: by quantum mechanical tunneling of charge carriers through the depletion region of the p-n junction, and by charge carriers passing over the barrier of the p-n junction.

As the bias voltage is increased from zero in the forward direction, the current through the device due to tunneling rises to a maximum and then falls to zero. The rise and fall of current due to tunneling occurs over a short range of forward bias voltage; generally less than one volt, and is believed to cause the negative resistance characteristics of the device. The current in the forward direction due to charge carriers passing over the barrier of the p-n junction is insignificant at the voltages at which current conduction by tunneling occurs. At higher forward bias voltages, where current conduction by tunneling has essentially stopped, current conduction over the barrier becomes significant.

A more complete understanding of the manner in which the diode operates as a negative resistance element can be had by referring to the curve of FIGURE 3*a*. The current-voltage characteristic curve 27 of a typical diode suitable for use in the invention is shown in FIGURE 3*a*, with the average value of the negative slope indicated by the straight line 28. For comparison, a curve 29 for a diode having a junction which is broad rather than abrupt, is illustrated in FIGURE 3*b*. The current scales depend on area and doping of the junction, but representative currents are in the milliampere range.

For sufficiently degenerate diodes, (greater than $10^{19}$ carriers cm.$^{-3}$ in germanium), there is a copious supply of free carriers at the Fermi level in both the p and n regions. Hence for an abrupt junction a large current passes in both directions through the barrier even though no voltage is applied. The total current is zero (point *a*, FIGURE 3*a*.)

For a small voltage in the back direction, the displacement of the Fermi level on crossing the junction increases the back current of electrons without changing the forward current. This back current results because the number of electrons on the right side of the junction, which see equal-energy states on the left to which they can tunnel is increased by the back bias, while the states to the right accessible to electrons from the left are but little changed. The corresponding characteristic is that of region *b* of FIGURE 3*a*.

For small forward bias, the characteristic is substantially symmetrical, (FIGURE 3*a*, region *c*). Now the forward current results because the number of electrons on the right which can tunnel back is decreased by the displacement of the Fermi level, while again the forward tunneling is roughly constant.

At higher forward bias, the back current becomes small and the net forward current reaches a maximum (region *d*, FIGURE 3*a*). It drops with further increase in voltage as the Fermi level on the left approaches and enters the level of the forbidden region on the right, making the forward tunneling decrease. This drop continues (FIGURE 3*a*, region *e*) until eventually normal injection over the barrier becomes important and the characteristic turns into the usual forward behavior (region *f*, FIGURE 3*a*).

Thus, the negative conductance diode 10 shown in FIGURE 1 has the operating characteristics as illustrated in FIGURE 3*a*, and may be constructed in the manner described above.

The operation of the arrangement of FIGURE 1 may be described with the aid of the curves shown in FIGURE 4. The current-voltage characteristic curve of the diode may be plotted using known measuring and testing procedures. It is assumed that a diode 10 having a current-voltage characteristic curve 31 with a negative slope portion as shown in FIGURE 4 is selected for use. A point 32 is selected on the negative slope of the curve 31 which permits a desired A.C. signal voltage swing about the point on the negative slope for a given input signal voltage. This is preferably at the steepest part of the negative slope. The battery 12 and resistance 13 are simultaneously adjacent so that the diode 10 is biased for conduction at the point 32. A zero resistance condition in the D.C. circuit including resistor 13 and battery 12 may be represented by the line 33 of FIGURE 4. The D.C. resistance can be increased to a condition represented by line 34 defined as critical D.C. resistance. Any further increase in the resistance results in the resistance intersecting the curve 31 more than once. It is known that in the latter condition, the diode assumes a level of current conduction according to one or the other point corresponding to points of stable operating conditions at which the resistance line intersects the curve 31, and does not assume a stable conduction level at the desired point 32.

Since zero D.C. resistance is not normally realized and since the critical D.C. resistance should not be exceeded, the D.C. resistance will in actual practice occur in the operating region somewhere between the values represented by lines 33, 34 of FIGURE 4. By way of example, the resistor 13 and battery 12 may be adjusted to provide an effective D.C. resistance represented by line 40.

The alternating current signal voltage 35 of frequency $f_1$ to be amplified is applied to the tank via terminals 16, 17 and the impedance matching tap 18. The diode 10 conducts at a level varying about the point 32 on the negative slope determined by the swing of the input signal voltage 35. In the example given, an A.C. voltage swing between limits 36, 37 occurs. The resulting diode current 38 which is 180° out of phase with the applied signal voltage because of the negative resistance of the diode is conveyed via tap 18 and terminals 19, 20 to a utilization circuit as well as to the input signal source.

It will be noted that the signal source, signal load, and diode, represented respectively by the conductances $G_g$, $G_L$, and the conductance of the diode 10, are effectively connected in parallel. An incremental change in the signal source voltage tends to produce an incremental change in current in one direction through the signal load. However, because of the negative resistance effect of the diode, the same incremental change in signal source voltage produces a change in current through the diode which is in the opposite direction to that through the load. The net effect is that the change in diode current flowing in the signal load supplements that current in the load produced by the signal source. In other words, the diode supplies power to the circuit to enable power gain.

Expressions for power gains ($g_p$), bandwidth ($2\Delta f$), and noise factor (F) of the amplifier of FIGURE 1 have been calculated. They are:

$$g_p=\frac{4G_gG_L}{\left(G_T-\left(\frac{n_1}{n_2}\right)^2G\right)^2} \quad (1)$$

$$B=\frac{1}{Q_L\sqrt{g_p}}[1+\sqrt{1+4Q_L^2g_p}]-2 \quad (2)$$

$$\cong\frac{1}{Q_L\sqrt{g_p}}\left[1+\frac{1}{4Q_L\sqrt{g_p}}\right](\text{if } Q_L\sqrt{g_p}\gg 1)$$

$$F=1+\frac{T}{T_0}\left[\frac{G_1}{G_g}+\frac{G_L}{G_g}+\frac{G_e}{G_g}\right] \quad (3)$$

where $$G_T=G_1+G_g+G_L \quad (4)$$

$$Q_L=\frac{\omega_1c_d}{2\sqrt{G_gG_L}}\left(\frac{n_1}{n_2}\right)^2 \quad (5)$$

$$G_e=\frac{eI_0}{2kT}\left(\frac{n_1}{n_2}\right)^2 \quad (6)$$

$$B=\frac{2\Delta f}{f_1} \quad (7)$$

It is assumed that the primary noise in the negative-conductance diode 10 is shot effect. $G_e$ is the equivalent transformed noise conductance due to the shot effect of the diode which has a D.C. current $I_0$.

An amplifier constructed according to the embodiment of the invention shown in FIGURE 1 was successfully operated at frequencies of 80 mc. (megacycles per second), 66 mc. and 30 mc. They all gave stable gains of about 20 db (decibels). Representative measurements at 30 mc./sec. are shown in the below table.

| $I_0$ Diode current ($\mu$a.) | G Negative conductance (mho) | $G_L$ Load conductance (mho) | $g_p$ Power gain (db) | | $2\Delta f$ Bandwidth (mc.) | | N. F. Noise Factor (db) | |
|---|---|---|---|---|---|---|---|---|
| | | | Meas. | Comp. | Meas. | Comp. | Meas. | Comp. |
| 250 | $-\frac{1}{375}$ | $\frac{1}{100}$ | 20 | 23 | .2 | .3 | 4.5 | 4.7 |
| 300 | $-\frac{1}{310}$ | $\frac{1}{200}$ | 40 | 36 | .19 | .16 | 6.3 | 5.5 |
| 350 | $-\frac{1}{208}$ | $\frac{1}{50}$ | 27 | 26 | .8 | 1.05 | 8 | 6.8 |

The computed gains, bandwidth, and noise factor are based on Equations 1–3, using values of $G_g$=.02 mho, $C_d$ (diode capacitance=40 $\mu\mu$f. (micromicrofarad) and $$\left(\frac{n_1}{n_2}\right)^2=7.65$$

These values were used in deriving the above results. It is apparent that the computed results substantially agree with those measured. The amplifier has much broader bandwidth at low gains. For instance, typical measured bandwidths at 10 db gain are of the order of 3 or 4 mc. According to Equation 2, the bandwidth varies inversely as the voltage gain at high values of circuit Q's.

According to Equation 3, a low ratio of current to negative conductance in the circuit of FIGURE 1 gives a low noise factor. A diode might be made with a negative conductance $G=-.02$ mho, at a diode current $I_0=200$ $\mu$a, giving a conductance ratio $G_e/G_g=0.20$, and hence a noise factor of the order of a few tenths of a db, substantially independently of the operating frequency over a wide frequency range. While certain values and results are given herein by way of example, and certain theories and equations are advanced as explanatory of these results, the invention is not to be considered as limited thereto. Other values may be used and corresponding results expected according to the particular application of the invention.

Another embodiment of the invention suitable for use up to a frequency range, for example, of 5000 mc., is illustrated in FIGURE 5. A cavity resonator 42, which may be made of copper in a known manner, is constructed to resonate at a desired high frequency of operation in the megacycles range. The dimensions of the resonator 42 may be in the order of centimeters. A member 43 which may be made of copper is affixed at one of its ends to one resonator wall 42*a* as by soldering. The member projects internally of the cavity resonator 42. A p-n junction, negative-conductance diode 44, which may be similar to the diode 10 of FIGURE 1 and the diode shown in FIGURE 2, is connected at one side 44*a* of the junction to the member 43. The cavity resonator 42 may be cylindrical, and the member 43 may be positioned centrally with the diode 44 also located along the axis of the resonator 42.

The diode 44 extends through an opening in the wall of the resonator 42 so as to provide a gap 56, the capacity across which corresponds in operation to the condenser 15 shown in FIGURE 1. The gap may be filled with a suitable dielectric material such as Teflon. The other side 44*b* of the diode junction is coupled to a point of reference potential over a path including an R.F. choke 45, resistance 46 and a battery or source of unidirectional potential 47. The resonator 42 is also coupled to the point of reference potential by suitable means.

The input signal voltage to be amplified is applied to the resonator 42 by a coaxial cable 48. The cable 48 includes an inner conductor 49 which extends into the cavity of the resonator 42 and is terminated by a disc 50 positioned so as to couple the input circuit to the electric field within the resonator cavity. As indicated, the disc 50 is arranged to be adjustably positioned within the cavity to provide the proper impedance matching. The amplified output signal is derived from the resonator 42 by means of a coaxial cable 51 having an inner conductor 52. The conductor 52 terminates in a disc 53 (similar to the disc 50) which is also indicated as being adjustable to provide proper impedance matching. The disc 53 is positioned so as to couple the output circuit to the electric field within the cavity resonator 42. A capacitive screw 54, or other known means, may be provided for tuning the resonator 42.

The operation of the embodiment shown in FIGURE 5 is similar to that of the amplifier of FIGURE 1. Resistance 46 and battery 47 are adjusted to bias the diode 44 for operation at a point on the negative slope of the current-voltage characteristic curve of the diode 44. The diode 44 is driven through an A.C. signal swing about the operating point as a result of the input signal supplied via cable 48 and disc 50. The resulting amplified signal is derived from the resonator 42 by the coaxial cable 51 and probe 53.

Thus, a negative conductance amplifier is provided having gain, bandwidth and noise factor which compare favorably with previously known amplification devices. Since the diode used for amplification may be quite small and may have dimensions in the order of mils, an amplifier which is small and compact in construction is provided. The amplifier has the further advantage of being relatively inexpensive to construct as compared to previously known arrangements using other amplifying devices.

What is claimed is:

1. A negative conductance amplifier comprising, an abrupt p-n junction semiconductor diode exhibiting negative resistance and having a current-voltage characteristic curve including a negative slope portion, an inductor, a direct current blocking condenser, means to connect said inductor and said condenser in series across said diode to form a resonant circuit for determining the amplifier resonant frequency, means connecting the junction of said condenser and said inductor to a point of reference potential, means providing a source of unidirectional potential connected between said point of reference potential and the junction of said diode and said condenser, the direct-current resistance of said source of unidirectional potential being less than the absolute value of the minimum negative resistance of said diode and the voltage of said source being of a value to supply a bias voltage to said diode to forward bias said diode to an operating point at the steepest point on said negative slope, a tap connection on said inductor, an input circuit connected between said tap and said point of references potential for applying an alternating current signal to be amplified to said resonant circuit, and an output circuit connected between said tap and said point of reference potential for deriving the amplified alternating current signal from said resonant circuit, said tap providing impedance match between said resonant circuit and said input and output circuits, the effective alternating current impedance of said input and output circuits and said resonant circuit presented across said diode being less than the absolute value of the minimum negative resistance of said diode.

2. A negative conductance amplifier comprising a cavity resonator, a voltage controlled semiconductor negative resistance diode mounted within said resonator and having a current-voltage characteristic curve including a portion of negative slope, said diode and said resonator jontly forming a resonant circuit, bias circuit means to stably forward bias said diode to an operating point on the negative slope portion of the diode characteristic for operation around said point, means to apply a signal to be amplified to said circuit, and means to derive an amplified signal output from said circuit.

3. A negative conductance amplifier comprising, a cavity resonator having first and second walls, a semiconductor diode having a current-voltage characteristic curve including a portion of negative slope, means for mounting said diode within said resonator so that one side of said diode is electrically connected to one wall of said resonator and the other side of said diode extends into an opening in a second wall of said resonator, whereby a gap between said diode and said second wall functions as direct current blocking capacitance, said diode and said resonator jointly forming a resonant circuit, a direct current biasing means including a source of unidirectional potential coupled between the first and second walls of said resonator to stably forward bias said diode to an operating point on the negative resistance slope portion of the diode characteristic for operation about said point, the resistance of said biasing means appearing between said first and second walls being less than the absolute value of the minimum negative reistance of said diode on said negative slope, means to connect said resonator to said input means connected to said resonator and arranged to couple an alternating current signal of said frequency to be amplified to the electric field within the cavity of said resonator, and output means connected to said resonator and arranged to derive the amplified alternating current signal from said resonator.

4. A negative conductance amplifier as claimed in claim 3 and wherein said input and output means each comprise a coaxial cable having an inner conductor extending into the cavity of said resonator.

5. A negative conductance amplifier comprising a voltage controlled negative resistance junction diode, an inductor coupled to said diode to resonate with the junction capacitance of said diode at the frequency of a signal to be amplified, means providing a biasing circuit for forward biasing said diode to an operating point on the negative resistance portion of the diode characteristic, said biasing circuit connected in series for direct current with said inductor across said diode and having a direct-current resistance which is less than the absolute value of the minimum negative resistance of said diode and means providing signal circuits effectively connected in parallel with said diode.

6. A negative conductance amplifier comprising a voltage controlled negative resistance junction diode, an inductor and a capacitor connected in series across said diode to resonate with the junction capacitance of said diode at the frequency of a signal to be amplified, means providing a biasing circuit having a direct current resistance which is less than the absolute value of minimum negative resistance of said diode and connected in parallel with said capacitor for forward biasing said diode to an operating point on the negative resistance portion of the diode characteristic, said capacitor effectively bypassing around said biasing circuit signals at the amplifier resonant frequency and means providing signal circuits effectively connected in parallel with said diode.

7. A negative conductance amplifier as claimed in claim 6 wherein said biasing circuit comprises the series combination of a source of unidirectional potential, a resistor, and a radio frequency choke coil.

8. A high frequency negative conductance amplifier comprising a voltage controlled negative resistance junction diode, a resonant high frequency structure including a pair of conductive members, means coupling said diode between said members, means providing a biasing circuit connected across said members for forward biasing said diode to an operating point on the negative resistance portion of said diode charcteristic, said biasing circuit having an effective direct current resistance that is less than the absolute value of average negative resistance of said diode and means providing signal circuits effectively connected in parallel with said diode.

9. A negative conductance amplifier comprising a voltage controlled negative resistance junction diode, a high frequency resonant circuit enclosure including a pair of conductive members, means for coupling said diode between said members within said high frequency enclosure, means providing a biasing circuit connected across said members for forward biasing said diode to an operating point on the negative resistance portion of the diode characteristic, said biasing circuit having an effective direct current resistance that is less than the absolute value of average negative resistance of said diode and means providing signal circuits effectively connected in parallel with said diode.

10. A negative conductance amplifier circuit comprising, a semiconductor negative resistance diode included in said circuit, said diode having a current voltage characteristic curve including a negative slope portion, means for applying to said circuit an alternating current signal and for deriving from said circuit an output signal, and bias circuit means to stably bias said diode to an operating point on the negative slope portion of the diode characteristic for operation around said point.

11. A negative conductance amplifier circuit comprising a voltage controlled negative resistance diode, said diode having a current-voltage characteristic curve including a negative slope portion, means for applying to said amplifier circuit an alternating current signal and for deriving from said circuit an output signal, and bias circuit means connected to said diode to stably bias said diode to an operating point on the negative slope portion of the diode characteristic for operation about said point, said bias circuit means presenting a direct-current resistance to said diode which is less than the absolute value of the negative resistance of said diode at said operating point.

12. A negative conductance amplifier circuit as defined by claim 11 wherein said operating point is at the steepest point of said negative slope portion.

13. A negative conductance amplifier circuit comprising a voltage controlled negative resistance diode, said diode having a current-voltage characteristic curve including a negative slope portion, signal input and output circuit means coupled in parallel with said diode for applying to said amplifier circuit an alternating current signal and for deriving from said circuit an output signal, bias circuit means connected to said diode to stably bias said diode to an operating point on the negative slope portion of the diode characteristic for operation about said point, said bias circuit means presenting a direct-current resistance to said diode which is less than the absolute value of the negative resistance of said diode at said operating point, the effective alternating current impedance of said signal input and output circuit means being less than the absolute value of the negative resistance of said diode at the operating point.

14. A negative conductance amplifier comprising a resonant circuit for determining the amplifier resonant frequency, a semiconductor negative resistance diode, said diode having a current-voltage characteristic curve including a negative slope portion, means for applying to said circuit an alternating current signal of a frequency substantially the same as the amplifier resonant frequency and for deriving from said circuit an output signal, and bias circuit means to stably bias said diode to an operating point on the negative slope portion of the diode characteristic for operation around said point.

15. A negative conductance amplifier circuit comprising a voltage controlled negative resistance semiconductor diode having a current-voltage characteristic including a portion with a negative slope portion, resonant circuit means for determining the amplifier resonant frequency coupled to said diode, biasing circuit means for stably biasing said diode to an operating point on the negative slope portion of the diode characteristic, means connecting said bias circuit means across a portion of said resonant circuit means having a low impedance at said resonant frequency relative to the impedance of said resonant circuit means at said resonant frequency as presented to said diode so that the bias circuit means is direct-current conductively connected across said diode, the total direct-current resistance of said bias circuit means as presented to said diode being less than the absolute value of the minimum negative resistance of said diode, and signal input and output circuit means coupled to said resonant circuit means, the total conductance of said signal input and output circuit means as presented across said diode being greater than the absolute value of the negative conductance of the diode at said operating point.

16. A negative conductance amplifier circuit comprising a negative resistance diode having a current-voltage characteristic including a portion with a negative slope, operating circuit means coupled to said diode, biasing circuit means connected to said diode, the relationship of the voltage and resistance of said biasing circuit means as presented to said diode to the absolute value of the negative resistance of said diode being such as to establish a stable operating point for said diode on the negative slope portion of the diode characteristic, means providing a signal source, load impedance means, and means providing signal conveying connections between said operating circuit means and signal source and load impedance means, the total conductance of said signal source and load impedance means as presented across said diode being greater than the absolute value of the negative conductance of the diode at the operating point.

17. A negative conductance amplifier circuit comprising, a voltage controlled negative resistance diode, said diode having a current-voltage characteristic curve including a negative slope portion, signal input and output circuit means coupled in parallel with said diode for applying to said amplifier circuit an alternating current signal and for deriving from said circuit an output signal, bias voltage supply means connected across points in said amplifying circuit providing an impedance at signal frequencies which is low with respect to the impedance of said input and output circuits at signal frequencies, but which is of sufficiently high impedance to direct voltages to permit the development of a direct biasing voltage for said diode, said bias voltage supply means being connected across said diode through at least a portion of said signal input and output circuit means to stably bias said diode to an operating point on the negative slope portion of the diode characteristic for operation about said point, said bias circuit means presenting a direct-current resistance to said diode which is less than the absolute value of the negative resistance of said diode at said operating point, and the effective alternating current impedance of said signal input and output circuit means being less than the absolute value of the negative resistance of said diode at the operating point.

References Cited in the file of this patent

UNITED STATES PATENTS

| | | |
|---|---|---|
| 1,987,440 | Habann | Jan. 8, 1935 |
| 2,469,569 | Ohl | May 10, 1949 |
| 2,565,497 | Harling | Aug. 28, 1951 |
| 2,775,658 | Mason | Dec. 25, 1956 |
| 2,777,906 | Shockley | Jan. 15, 1957 |
| 2,843,765 | Aigrain | July 15, 1958 |
| 2,899,652 | Read | Aug. 11, 1959 |

FOREIGN PATENTS

| | | |
|---|---|---|
| 158,879 | Australia | Sept. 16, 1954 |